(12) United States Patent
Plett

(10) Patent No.: US 7,893,694 B2
(45) Date of Patent: *Feb. 22, 2011

(54) SYSTEM, METHOD, AND ARTICLE OF MANUFACTURE FOR DETERMINING AN ESTIMATED COMBINED BATTERY STATE-PARAMETER VECTOR

(75) Inventor: Gregory L. Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 297 days.

This patent is subject to a terminal disclaimer.

(21) Appl. No.: 12/141,021

(22) Filed: Jun. 17, 2008

(65) Prior Publication Data

US 2008/0249726 A1    Oct. 9, 2008

Related U.S. Application Data

(62) Division of application No. 11/350,418, filed on Feb. 9, 2006, now Pat. No. 7,400,115.

(51) Int. Cl.
*G01N 27/416* (2006.01)
*H02J 7/00* (2006.01)

(52) U.S. Cl. .................. 324/432; 320/132; 702/63

(58) Field of Classification Search ............... 324/432; 320/132

See application file for complete search history.

(56) References Cited

U.S. PATENT DOCUMENTS

| | | | |
|---|---|---|---|
| 4,390,841 A | 6/1983 | Martin et al. | |
| 5,578,915 A | 11/1996 | Crouch, Jr. et al. | |
| 6,353,815 B1 | 3/2002 | Vilim et al. | |
| 6,441,586 B1* | 8/2002 | Tate et al. | 320/132 |
| 6,515,454 B2* | 2/2003 | Schoch | 320/132 |
| 6,534,954 B1 | 3/2003 | Plett | |
| 6,927,554 B2* | 8/2005 | Tate et al. | 320/132 |
| 7,061,246 B2 | 6/2006 | Dougherty et al. | |
| 7,253,587 B2* | 8/2007 | Meissner | 320/132 |
| 7,327,147 B2* | 2/2008 | Koch | 324/427 |
| 7,400,115 B2 | 7/2008 | Plett | |
| 2001/0035739 A1 | 11/2001 | Laig-Horstebrock et al. | |
| 2002/0130637 A1 | 9/2002 | Schoch | |
| 2003/0015993 A1 | 1/2003 | Misra et al. | |
| 2003/0052690 A1 | 3/2003 | Schoch | |
| 2005/0046388 A1 | 3/2005 | Tate et al. | |
| 2005/0100786 A1 | 5/2005 | Ryu | |
| 2005/0127874 A1 | 6/2005 | Lim | |
| 2007/0035307 A1 | 2/2007 | Schoch | |

OTHER PUBLICATIONS

Gregory L. Plett, Extended Kalman Filtering for Battery Management Systems of LiPB-based HEV Battery Packs Part 3. State and Parameter Estimation, May 28, 2005, Journal of Power Sources 134 (2004) 277-292.
Pending U.S. Appl. No. 11/209,453, filed Aug. 23, 2005.
Pending U.S. Appl. No. 11/272,371, filed Nov. 10, 2005.
Pending U.S. Appl. No. 11/290,962, filed Nov. 30, 2005.

* cited by examiner

*Primary Examiner*—Edward Tso
*Assistant Examiner*—M'Baye Diao
(74) *Attorney, Agent, or Firm*—Cantor Colburn LLP

(57) ABSTRACT

A system, a method, and an article of manufacture for determining an estimated combined battery state-parameter vector are provided. The method determines the estimated combined battery state-parameter vector based on a plurality of predicted combined battery state-parameter vectors, a plurality of predicted battery output vectors, and a battery output vector.

2 Claims, 9 Drawing Sheets

---

68 — COMPUTER DETERMINES A PLURALITY OF ESTIMATED AUGMENTED COMBINED BATTERY STATE-PARAMETER VECTORS $X_{k-1}^{a,+}$ EACH INDICATIVE OF BOTH A STATE OF THE BATTERY AND A PARAMETER OF THE BATTERY AT THE SECOND PREDETERMINED TIME, UTILIZING THE EQUATION:

$$X_{k-1}^{a,+} = \{\hat{X}_{k-1}^{a,+}, \hat{X}_{k-1}^{a,+} + \gamma\sqrt{\Sigma_{\tilde{X},k-1}^{a,+}}, \hat{X}_{k-1}^{a,+} - \gamma\sqrt{\Sigma_{\tilde{X},k-1}^{a,+}}\}$$

WHERE, $\sqrt{\Sigma_{\tilde{X},k-1}^{a,+}}$ CORRESPONDS TO THE CHOLESKY MATRIX SQUARE ROOT OF $\Sigma_{\tilde{X},k-1}^{a,+}$; AND $\gamma$ CORRESPONDS TO A CONSTANT VALUE

---

70 — COMPUTER DETERMINES A PLURALITY OF PREDICTED COMBINED BATTERY STATE-PARAMETER VECTORS $X_k^{X,-}$ EACH INDICATIVE OF BOTH A STATE OF THE BATTERY AND A PARAMETER OF THE BATTERY AT THE FIRST PREDETERMINED TIME, UTILIZING THE EQUATION:

$$X_{k,i}^{X,-} = F(X_{k-1,i}^{X,+}, u_{k-1}, X_{k-1,i}^{W,+}, k-1)$$

WHERE, $X_{k,i}^{X,-}$ CORRESPONDS TO THE iTH MEMBER OF THE PLURALITY $X_k^{X,-}$ $u_{k-1}$ CORRESPONDS TO A BATTERY INPUT VECTOR AT THE SECOND PREDETERMINED TIME;

$X_{k-1,i}^{X,+}$ CORRESPONDS TO AN ESTIMATED COMBINED BATTERY STATE-PARAMETER VECTOR EXTRACTED FROM THE iTH MEMBER OF THE PLURALITY $X_{k-1}^{a,+}$;

$X_{k-1,i}^{W,+}$ CORRESPONDS TO AN ESTIMATED COMBINED BATTERY STATE-PARAMETER INPUT NOISE VECTOR, EXTRACTED FROM THE iTH MEMBER OF THE PLURALITY $X_{k-1}^{a,+}$; AND k-1 CORRESPONDS TO THE SECOND PREDETERMINED TIME

---

72 — COMPUTER DETERMINES A PLURALITY OF PREDICTED BATTERY OUTPUT VECTORS $Y_k$ EACH INDICATIVE OF OUTPUTS OF THE BATTERY AT THE FIRST PREDETERMINED TIME, UTILIZING THE EQUATION:

$$Y_{k,i} = h(X_{k,i}^{X,-}, u_k, X_{k-1,i}^{v,+}, k)$$

WHERE, $Y_{k,i}$ CORRESPONDS TO THE iTH MEMBER OF THE PLURALITY $Y_k$;

$X_{k-1,i}^{v,+}$ CORRESPONDS TO A SINGLE ESTIMATED SENSOR NOISE VECTOR EXTRACTED FROM THE iTH MEMBER OF THE PLURALITY $X_{k-1}^{a,+}$; AND k CORRESPONDS TO THE FIRST PREDETERMINED TIME

---

74 — COMPUTER DETERMINES A PREDICTED COMBINED BATTERY STATE-PARAMETER VECTOR $\hat{X}_k^-$ CORRESPONDING TO THE FIRST PREDETERMINED TIME BY CALCULATING A WEIGHTED AVERAGE OF THE PLURALITY OF PREDICTED COMBINED BATTERY STATE-PARAMETER VECTORS $X_k^{X,-}$, UTILIZING THE EQUATION:
$$\hat{X}_k^- = \sum_{i=0}^p \alpha_i^{(m)}, X_{k,i}^{X,-}$$
WHERE,
$\alpha_i^{(m)}$ CORRESPONDS TO A SET OF CONSTANT VALUES; AND
p CORRESPONDS TO THE NUMBER OF MEMBERS IN THE PLURALITY $X_k^{X,-}$, MINUS ONE

76 — COMPUTER DETERMINES A PREDICTED COMBINED BATTERY STATE-PARAMETER VECTOR COVARIANCE MATRIX $\Sigma_{\tilde{X},k}^-$, UTILIZING THE FOLLOWING EQUATION:
$$\Sigma_{\tilde{X},k}^- = \sum_{i=0}^p \alpha_i^{(c)} (X_{k,i}^{X,-} - \hat{X}_k^-)(X_{k,i}^{X,-} - \hat{X}_k^-)^T$$
WHERE, $\alpha_i^{(c)}$ CORRESPONDS TO A SET OF CONSTANT VALUES

78 — COMPUTER DETERMINES A PREDICTED BATTERY OUTPUT VECTOR $\hat{y}_k$ INDICATIVE OF OUTPUTS OF THE BATTERY AT THE FIRST PREDETERMINED TIME, UTILIZING THE EQUATION:
$$\hat{y}_k = \sum_{i=0}^p \alpha_i^{(m)} Y_{k,i}$$

80 — COMPUTER DETERMINES A PREDICTED BATTERY OUTPUT VECTOR COVARIANCE MATRIX $\Sigma_{\tilde{y},k}$ UTILIZING THE EQUATION:
$$\Sigma_{\tilde{y},k} = \sum_{i=0}^p \alpha_i^{(c)} (Y_{k,i} - \hat{y}_k)(Y_{k,i} - \hat{y}_k)^T$$

82 — COMPUTER DETERMINES A PREDICTED CROSS-COVARIANCE MATRIX $\Sigma_{\tilde{X}\tilde{y},k}^-$ UTILIZING THE EQUATION:
$$\Sigma_{\tilde{X}\tilde{y},k}^- = \sum_{i=0}^p \alpha_i^{(c)}, (X_{k,i}^{X,-} - \hat{X}_k^-)(Y_{k,i} - \hat{y}_k)^T$$

84 — COMPUTER DETERMINES A GAIN MATRIX $L_k$, UTILIZING THE FOLLOWING EQUATION:
$$L_k = \Sigma_{\tilde{X}\tilde{y},k}^- \Sigma_{\tilde{y},k}^{-1}$$

112 — COMPUTER DETERMINES A PREDICTED COMBINED BATTERY STATE-PARAMETER VECTOR $\hat{X}_k^-$ CORRESPONDING TO THE FIRST PREDETERMINED TIME BY CALCULATING A WEIGHTED AVERAGE OF THE PLURALITY OF PREDICTED COMBINED BATTERY STATE-PARAMETER VECTORS $X_k^{X,-}$, UTILIZING THE EQUATION:

$$\hat{X}_k^- = \sum_{i=0}^{p} \alpha_i^{(m)} X_{k,i}^{X,-}$$

WHERE, $\alpha_i^{(m)}$ CORRESPONDS TO A SET OF CONSTANT VALUES; AND p CORRESPONDS TO THE NUMBER OF MEMBERS IN THE PLURALITY $X_k^{X,-}$, MINUS ONE

114 — COMPUTER DETERMINES A PREDICTED COMBINED BATTERY STATE-PARAMETER VECTOR COVARIANCE MATRIX $\Sigma_{\tilde{X},k}^-$, UTILIZING THE EQUATION:

$$S_{\tilde{X},k}^- = qr\left\{\left[\sqrt{\alpha_i^{(c)}}(X_{k,(0:p)}^{X,-} - \hat{X}_k^-)^T\right]\right\}^T$$

WHERE, $\alpha_i^{(c)}$ CORRESPONDS TO A SET OF CONSTANT VALUES AND qr { } IS A FUNCTION THAT COMPUTES A Q-R MATRIX DECOMPOSITION OF ITS INPUT ARGUMENT AND RETURNS THE UPPER-TRIANGULAR PORTION OF THE R MATRIX

116 — COMPUTER DETERMINES A PREDICTED BATTERY OUTPUT VECTOR $\hat{y}_k$ INDICATIVE OF OUTPUTS OF THE BATTERY AT THE FIRST PREDETERMINED TIME, UTILIZING THE EQUATION:

$$\hat{y}_k = \sum_{i=0}^{p} \alpha_i^{(m)} Y_{k,i}$$

118 — COMPUTER DETERMINES A PREDICTED BATTERY OUTPUT VECTOR SQUARE-ROOT COVARIANCE MATRIX $S_{\tilde{y},k}$, UTILIZING THE EQUATION:

$$S_{\tilde{y},k} = qr\left\{\left[\sqrt{\alpha_i^{(c)}}(Y_{k,(0:p)} - \hat{y}_k)^T\right]\right\}^T$$

120 — COMPUTER DETERMINES A PREDICTED CROSS-COVARIANCE MATRIX $\Sigma_{\tilde{X}\tilde{y},k}^-$ UTILIZING THE EQUATION:

$$\Sigma_{\tilde{X}\tilde{y},k}^- = \sum_{i=0}^{p} \alpha_i^{(c)} (X_{k,i}^{X,-} - \hat{X}_k^-)(Y_{k,i} - \hat{y}_k)^T$$

Figure 8

SYSTEM, METHOD, AND ARTICLE OF MANUFACTURE FOR DETERMINING AN ESTIMATED COMBINED BATTERY STATE-PARAMETER VECTOR

CROSS REFERENCE TO RELATED APPLICATION

This application is a divisional of copending U.S. patent application Ser. No. 11/350,418, filed on Feb. 9, 2006, the content of which is incorporated herein by reference in its entirety.

BACKGROUND OF THE INVENTION

The present application relates to a system, a method, and an article of manufacture for estimating a battery pack system state and model parameters using digital filtering techniques.

In the context of rechargeable battery pack technologies, it is desired in some applications to be able to estimate quantities that are descriptive of the present battery pack condition, but that may not be directly measured. Some of these quantities may change rapidly, such as the pack state-of-charge (SOC), which can traverse its entire range within minutes. Others may change very slowly, such as cell capacity, which might change as little as 20% in a decade or more of regular use. The quantities that tend to change quickly comprise the "state" of the system, and the quantities that tend to change slowly comprise the time varying "parameters" of the system.

In the context of the battery systems, particularly those that need to operate for long periods of time, as aggressively as possible without harming the battery life, for example, in Hybrid Electric Vehicles (HEVs), Battery Electric Vehicles (BEVs), laptop computer batteries, portable tool battery packs, and the like, it is desired that information regarding quickly varying parameters (e.g., SOC) be used to estimate how much battery energy is presently available to do work, and so forth. Further, it may be desirable to ascertain information regarding slowly varying parameters (e.g., total capacity) in order to keep the prior calculations precise over the lifetime of the pack, extending its useful service time, and help in determining the state-of-health (SOH) of the pack.

The inventor herein, however, has recognized that mathematical algorithms have been unable to provide a highly accurate estimate of an internal state and parameter of a battery because they are not sufficiently optimized for batteries having non-linear operational characteristics. Further, batteries generally have non-linear operational characteristics.

Accordingly, the inventor herein has recognized a need for a system and a method for more accurately determining an estimated battery state and parameter.

BRIEF DESCRIPTION OF THE INVENTION

A method for determining an estimated combined battery state-parameter vector indicative of both a state and a parameter of a battery at a first predetermined time in accordance with an exemplary embodiment is provided. The method includes determining a first plurality of estimated augmented combined battery state-parameter vectors that are indicative of both a state and a parameter of the battery, a battery input noise, a sensor noise associated with a sensor measuring a battery output variable, an uncertainty of both the state and parameter of the battery, an uncertainty of the battery input noise, and an uncertainty of the sensor noise, at a second predetermined time prior to the first predetermined time. The method further includes determining a second plurality of predicted combined battery state-parameter vectors that are indicative of both the state and the parameter of the battery and an uncertainty of the both state and parameter of the battery at the first predetermined time based on the first plurality of estimated augmented combined battery state-parameter vectors. The method further includes determining a third plurality of predicted battery output vectors that are indicative of at least one output variable of the battery and an uncertainty of the output variable at the first predetermined time based on the first plurality of estimated augmented combined battery state-parameter vectors and the second plurality of predicted combined battery state-parameter vectors. The method further includes determining a first battery output vector having at least one measured value of the battery output variable. The method further includes determining a first estimated combined battery state-parameter vector indicative of both the state and the parameter of the battery at the first predetermined time based on the second plurality of predicted combined battery state-parameter vectors, the third plurality of predicted battery output vectors, and the first battery output vector.

A system for determining an estimated combined battery state-parameter vector indicative of both a state and a parameter of a battery at a first predetermined time in accordance with another exemplary embodiment is provided. The system includes a sensor configured to generate a first signal indicative of an output variable of the battery. The system further includes a computer operably coupled to the sensor. The computer is configured to determine a first plurality of estimated augmented combined battery state-parameter vectors that are indicative of both a state and a parameter of the battery, a battery input noise, a sensor noise associated with the sensor, an uncertainty of both the state and parameter of the battery, an uncertainty of the battery input noise, and an uncertainty of the sensor noise, at a second predetermined time prior to the first predetermined time. The computer is further configured to determine a second plurality of predicted combined battery state-parameter vectors that are indicative of both the state and the parameter of the battery and an uncertainty of both the state and parameter of the battery at the first predetermined time based on the first plurality of estimated augmented combined battery state-parameter vectors. The computer is further configured to determine a third plurality of predicted battery output vectors that are indicative of an at least one output variable of the battery and an uncertainty of the output variable at the first predetermined time based on the first plurality of estimated augmented combined battery state-parameter vectors and the second plurality of predicted combined battery state-parameter vectors. The computer is further configured to determine a first battery output vector based on the first signal. The computer is further configured to determine a first estimated combined battery state-parameter vector indicative of both the state and the parameter of the battery at the first predetermined time based on the second plurality of predicted combined battery state-parameter vectors, the third plurality of predicted battery output vectors, and the first battery output vector.

An article of manufacture in accordance with another exemplary embodiment is provided. The article of manufacture includes a computer storage medium having a computer program encoded therein for determining an estimated combined battery state-parameter vector indicative of a state and a parameter of a battery at a first predetermined time. The computer storage medium includes code for determining a first plurality of estimated augmented combined battery state-parameter vectors that are indicative of both a state and a parameter of the battery, a battery input noise, a sensor noise associated with a sensor measuring a battery output variable, an uncertainty of both the state and parameter of the battery, an uncertainty of the battery input noise, and an uncertainty of the sensor noise at a second predetermined time prior to the first predetermined time. The computer storage medium further includes code for determining a second plurality of predicted combined battery state-parameter vectors that are indicative of the state and the parameter of the battery and an uncertainty of both the state and parameter of the battery at the first predetermined time based on the first plurality of estimated augmented combined battery state-parameter vectors. The computer storage medium further includes code for determining a third plurality of predicted battery output vectors that are indicative of at least one output variable of the battery and of an uncertainty of the output variable at the first predetermined time based on the first plurality of estimated augmented combined battery state-parameter vectors and the second plurality of predicted combined battery state-parameter vectors. The computer storage medium further includes code for determining a first battery output vector having at least one measured value of the battery output variable. The computer storage medium further includes code for determining a first estimated combined battery state-parameter vector indicative of both the state and the parameter of the battery at the first predetermined time based on the second plurality of predicted combined battery state-parameter vectors, the third plurality of predicted battery output vectors, and the first battery output vector.

Other systems and/or methods according to the embodiments will become or are apparent to one with skill in the art upon review of the following drawings and detailed description. It is intended that all such additional systems and methods be within the scope of the present invention, and be protected by the accompanying claims.

BRIEF DESCRIPTION OF THE DRAWINGS

FIGS. 2-5 are flowcharts of a method for determining an estimated combined battery state-parameter vector in accordance with another exemplary embodiment; and FIGS. 6-9 are flowcharts of a method for determining an estimated combined battery state-parameter vector in accordance with another exemplary embodiment.

DETAILED DESCRIPTION OF THE INVENTION

Figure 1:
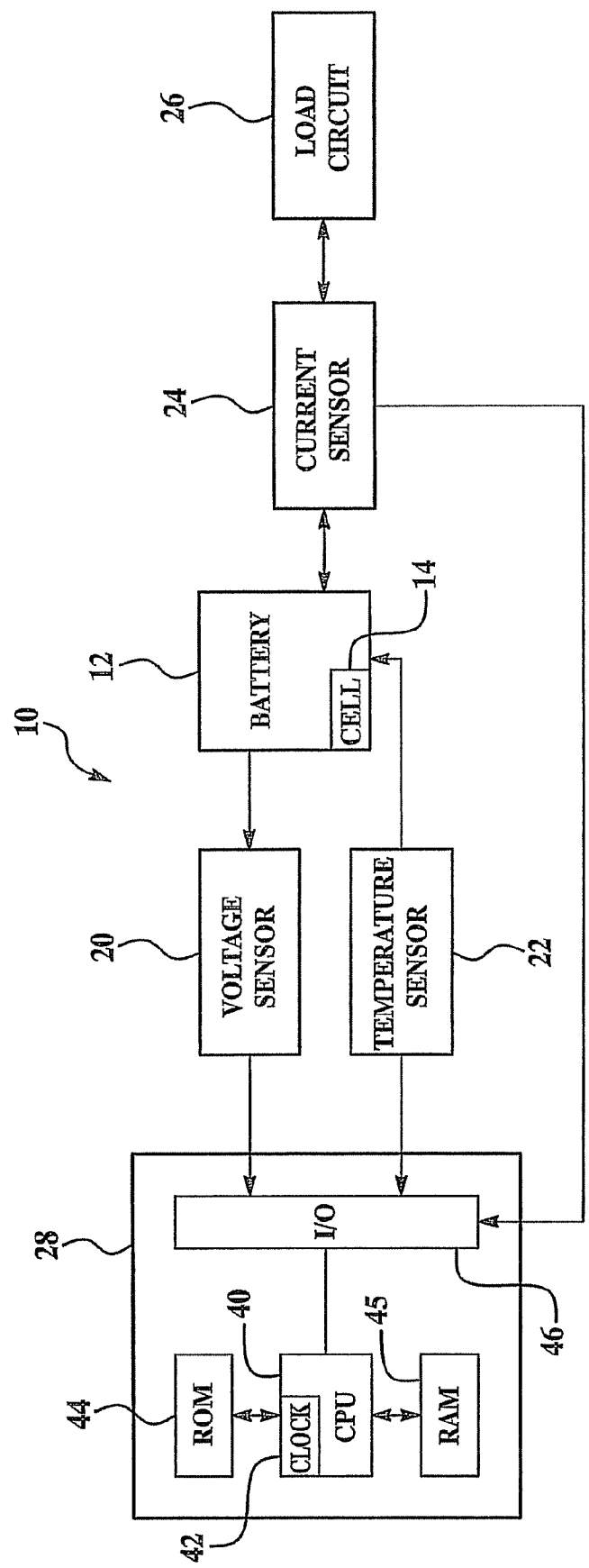
FIG. 1 is a schematic of a system for determining an estimated combined battery state-parameter vector in accordance with an exemplary embodiment.
Figure 2:
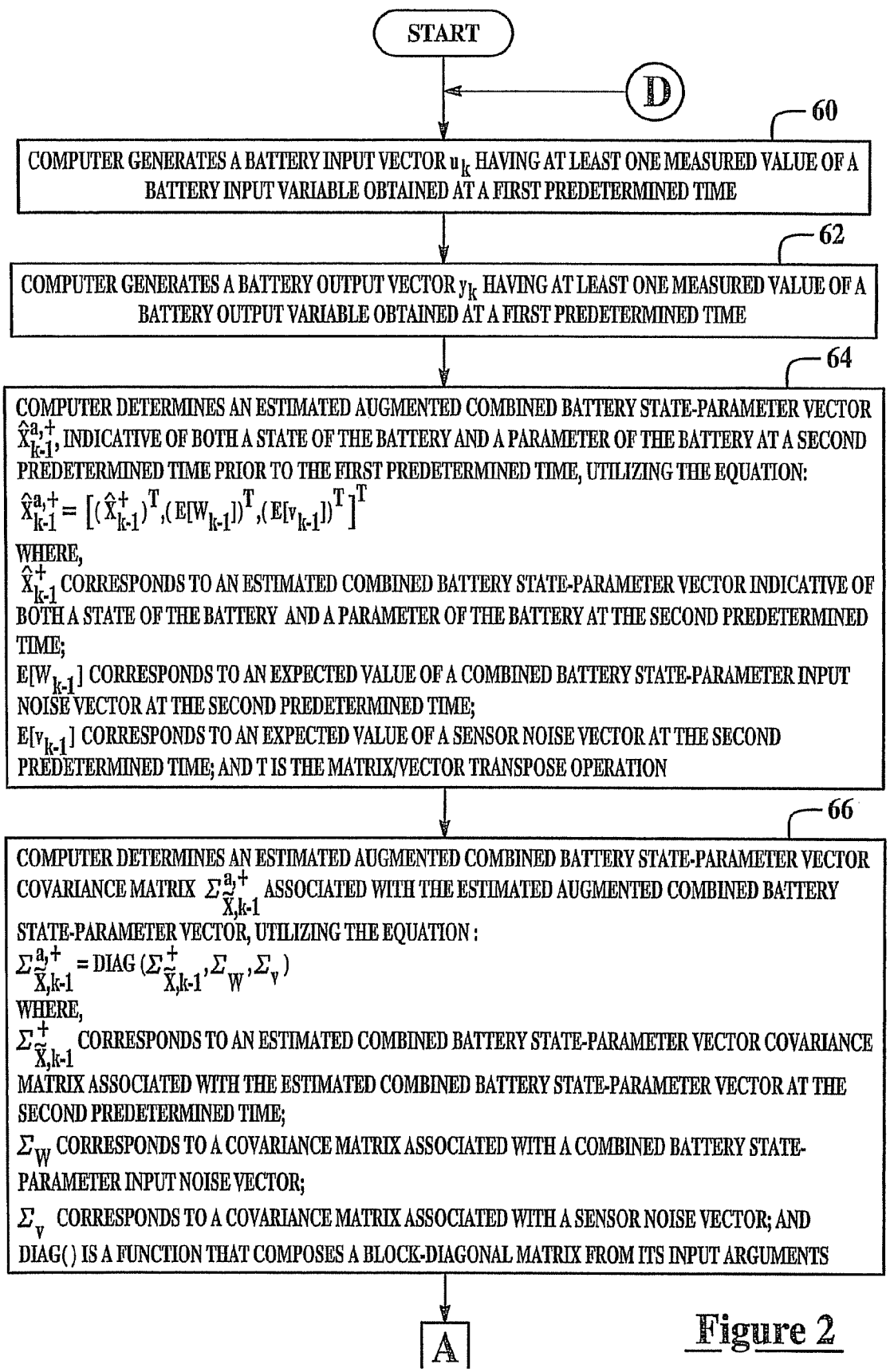
Figure 5:
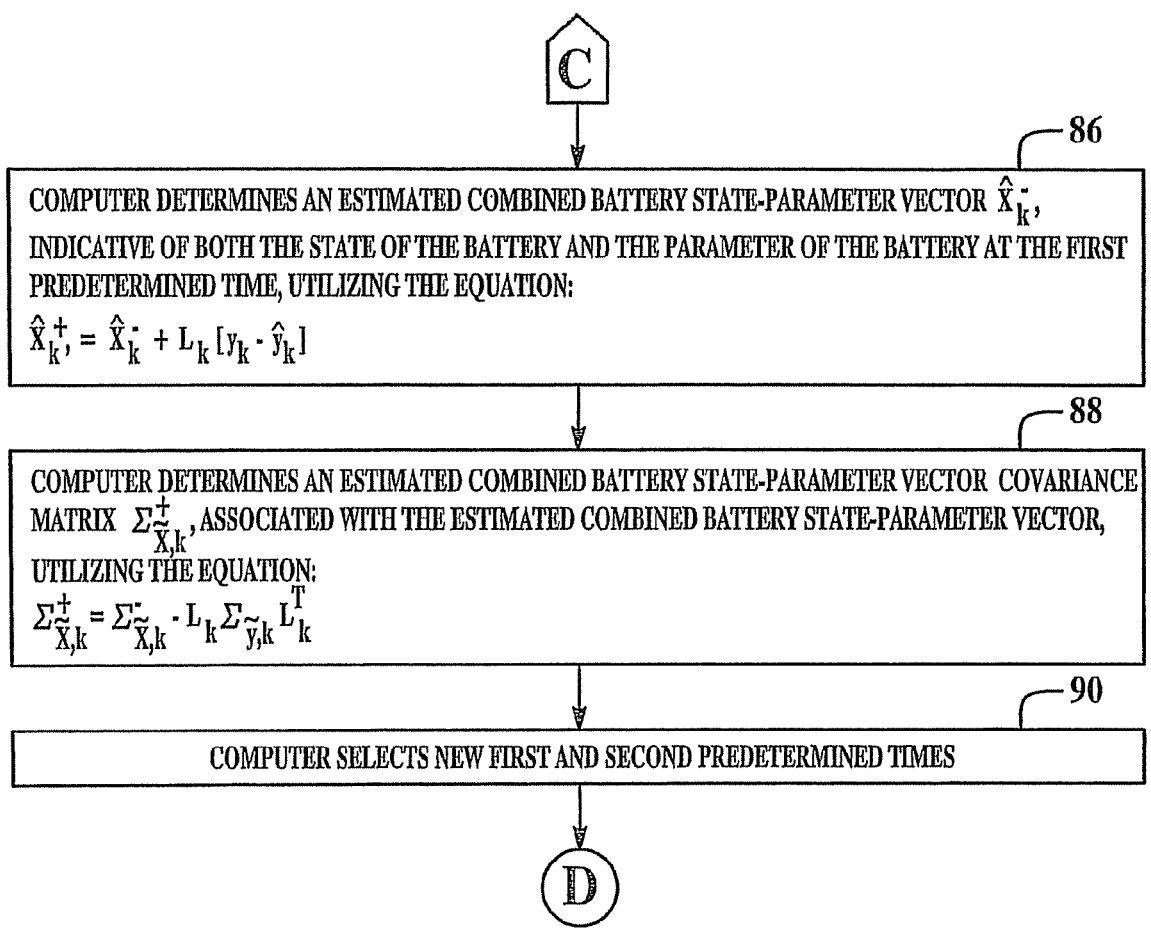
Figure 6:
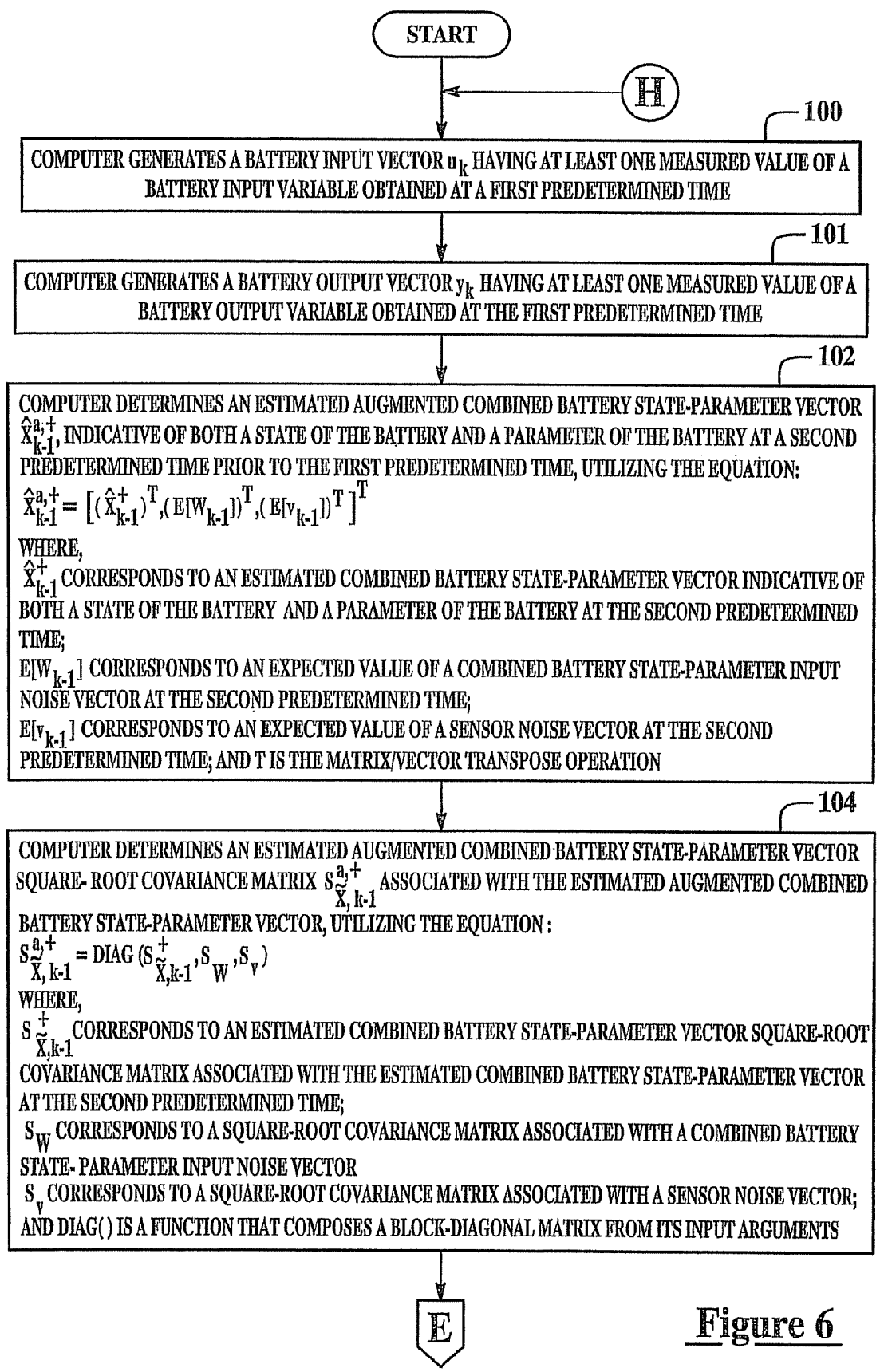
Figure 7:
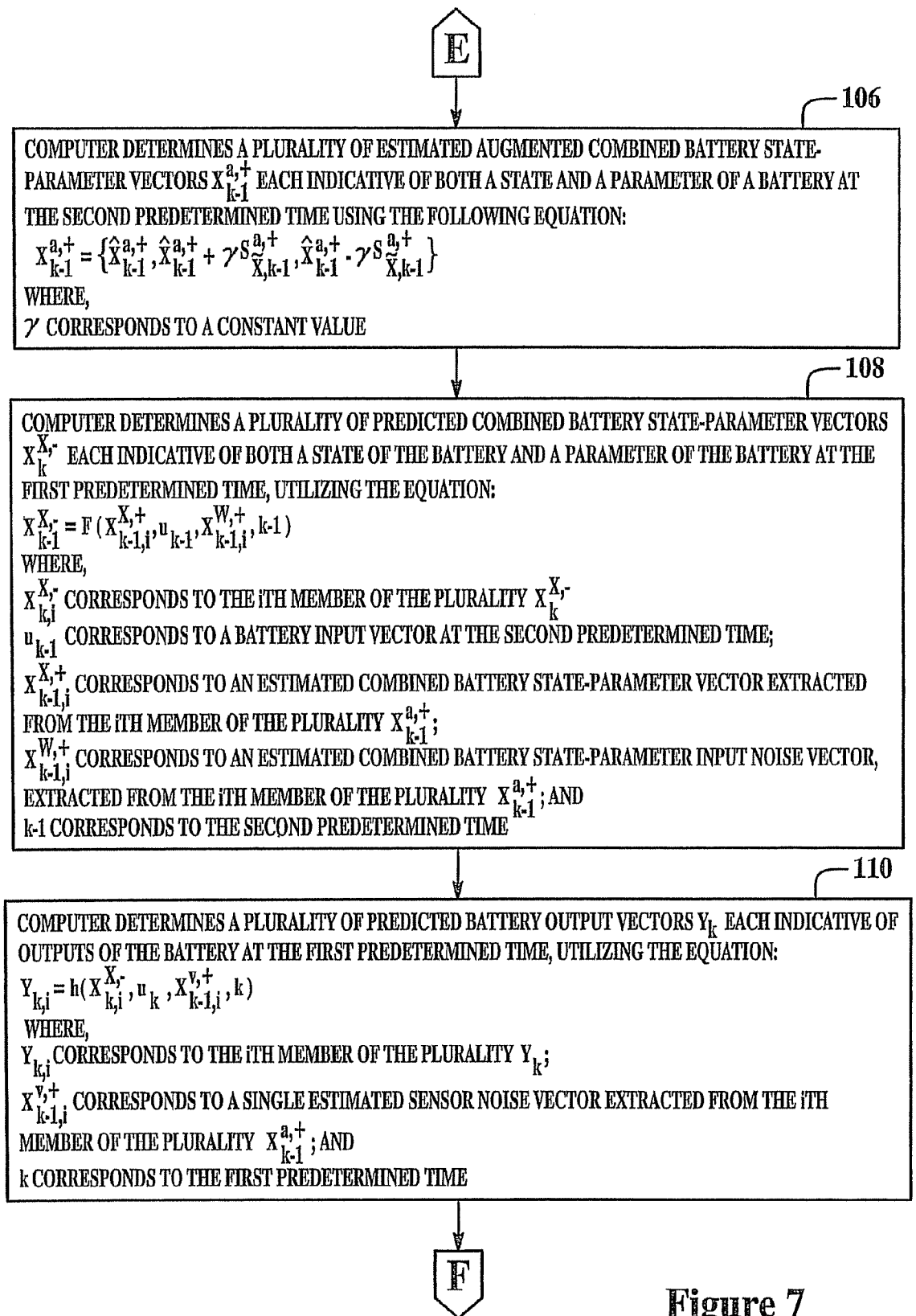
Figure 9:
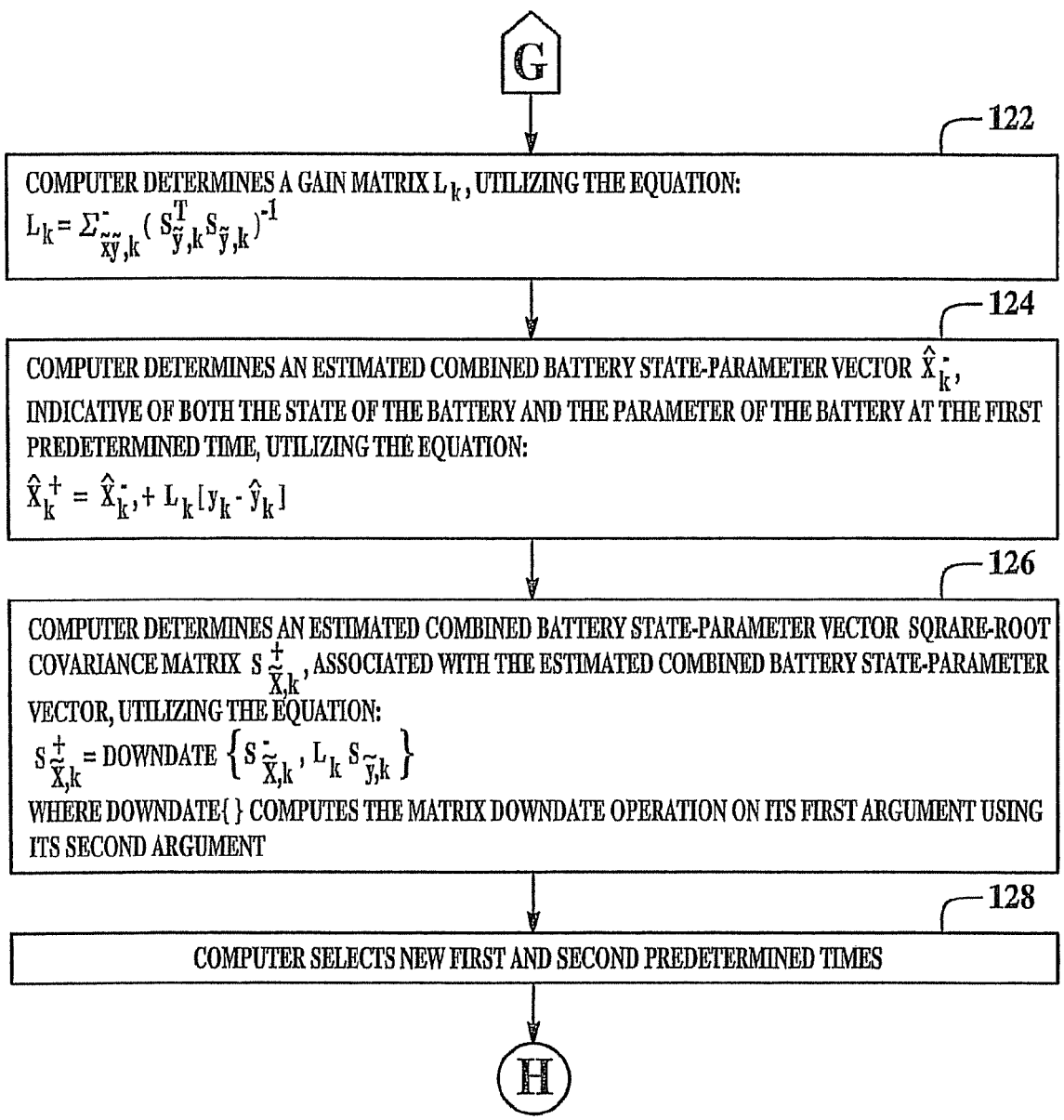

Referring to FIG. 1, a system 10 for determining an estimated combined battery state-parameter vector indicative of both a state and a parameter of a battery 12 is illustrated. The battery 12 includes at least a battery cell 14. Of course, the battery 12 can include a plurality of additional battery cells. Each battery cell can be either a rechargeable battery cell or a non-rechargeable battery cell. Further, each battery cell can be constructed using an anode and a cathode having electrochemical configurations known to those skilled in the art.

In the context of rechargeable battery pack technologies, it is desired in some applications to be able to estimate quantities that are descriptive of the present battery pack condition, but that may not be directly measured. Some of these quantities may change rapidly, such as the pack state-of-charge (SOC), which can traverse its entire range within minutes. Others may change very slowly, such as cell capacity, which might change as little as 20% in a decade or more of regular use. The quantities that tend to change quickly comprise the "state" of the system, and the quantities that tend to change slowly comprise the time varying "parameters" of the system.

In the context of the battery systems, particularly those that need to operate for long periods of time, as aggressively as possible without harming the battery life, for example, in Hybrid Electric Vehicles (HEVs), Battery Electric Vehicles (BEVs), laptop computer batteries, portable tool battery packs, and the like, it is desired that information regarding slowly varying parameters (e.g., total capacity) be available to determine pack health, and to assist in other calculations, including that of state-of-charge (SOC). Some exemplary parameters include, but are not limited to: cell capacity, resistance, polarization voltage time constant(s), polarization voltage blending factor(s), hysteresis blending factor(s), hysteresis rate constant(s), efficiency factor(s), and so forth.

An input variable is defined as a value of a battery input signal at a specific time. For example, an input variable can comprise one of a current entering the battery and a temperature of the battery. An output variable is defined as a value of a battery output signal at a specific time. For example, an output variable can comprise one of a battery output voltage and a battery pressure.

The system 10 includes one or more voltage sensors 20, a load circuit 26, and a computational unit such as a computer 28, and may also include one or more of a temperature sensor 22, and a current sensor 24.

The voltage sensor 20 is provided to generate a first output signal indicative of the voltage produced by one or more of the battery cells of the battery 12. The voltage sensor 20 is electrically coupled between the I/O interface 46 of the computer 28 and the battery 12. The voltage sensor 20 transfers the first output signal to the computer 28. For clarity of presentation, a single voltage sensor will be described herein. However, it should be noted that in an alternate embodiment of system 10 a plurality of voltage sensors (e.g., one voltage sensor per battery cell) are utilized in system 10.

The temperature sensor 22 is provided to generate a second output signal indicative of one or more temperatures of the battery 12. The temperature sensor 22 is disposed proximate the battery 12 and is electrically coupled to the I/O interface 46 of the computer 28. The temperature sensor 22 transfers the second output signal to the computer 28. For clarity of presentation, a single temperature sensor will be described herein. However, it should be noted that in an alternate embodiment of system 10 a plurality of temperature sensors (e.g., one temperature sensor per battery cell) are utilized in system 10.

The current sensor 24 is provided to generate a third output signal indicative of a current sourced or sunk by the battery cells of the battery 12. The current sensor 24 is electrically coupled between the battery 12 and the load circuit 26. The current sensor 24 is further electrically coupled to the I/O interface 46 of the computer 28. The current sensor 24 transfers the third output signal to the computer 28.

The load circuit 26 is electrically coupled to the current sensor 24 and sinks or sources a current from the battery 12. The load circuit 26 comprises any electrical device that can be electrically coupled to the battery 12.

The computer 28 is provided for determining an estimated combined battery state-parameter vector indicative of both a state and a parameter of a battery 12, as will be explained in greater detail below. The computer 28 includes a central processing unit (CPU) 40, a read-only memory (ROM) 44, a volatile memory such as a random access memory (RAM) 45 and an input/output (I/O) interface 46. The CPU 40 operably communicates with the ROM 44, the RAM 45, and the I/O interface 46. The CPU 40 includes a clock 42. The computer readable media including ROM 44 and RAM 46 may be implemented using any of a number of known memory devices such as PROMs, EPROMs, EEPROMS, flash memory or any other electric, magnetic, optical or combination memory device capable of storing data, some of which represent executable instructions used by the CPU 40.

For purposes of understanding, the notation utilized in the equations of the following methods will be described. The circumflex symbol indicates an estimated or predicted quantity (e.g., $\hat{x}$ indicates an estimate of the true quantity x). The superscript symbol "−" indicates an a priori estimate (i.e., a prediction of a quantity's present value based on past data). The superscript symbol "+" indicates an a posteriori estimate (e.g., $\hat{x}_k^+$ is the estimate of true quantity x at time index k based on all measurements taken up to and including time k). The tilde symbol indicates the error of an estimated quantity (e.g., $\tilde{x}_k^- = x_k - \hat{x}_k^-$ and $\tilde{x}_k^+ = x_k - \hat{x}_k^+$). The symbol $\Sigma_{xy} = E[xy^T]$ indicates the correlation or cross correlation of the variables in its subscript (the quantities described herein are zero-mean, so the correlations are identical to covariances). The symbol $\Sigma_x$ indicates the same quantity as $\Sigma_{xx}$. The superscript "T" is a matrix/vector transpose operator.

Before providing a detailed discussion of the methodologies for determining a battery parameter vector associated with the battery 12, a general overview will be provided.

A battery state vector may include, for example, a state of charge (SOC) value associated with the battery 12, a hysteresis voltage, or a polarization voltage. The SOC value is a value from 0-100 percent that indicates a present available capacity of the battery 12 that may be used to do work.

A mathematical model of battery cell behavior is used in the method to compute an estimate of the state vector of the battery 12. It is assumed that a mathematical model of the battery cell dynamics is known, and may be expressed using a discrete-time state-space model comprising a state equation and an output equation, as will be described below.

The state equation utilized to determine the state vector associated with the battery 12 is as follows: $x_k = f(x_{k-1}, u_{k-1}, w_{k-1}, k-1)$ wherein, $x_k$ is the state vector associated with the battery 12 at time index k;

$u_k$ is a variable representing a known/deterministic input to the battery 12;

$w_k$ is a battery input noise vector that models some unmeasured input which affects the state of the system; and $f(x_{k-1}, u_{k-1}, w_{k-1}, k-1)$ is a state transition function.

An output vector associated with the battery 12 is determined utilizing the following equation: $y_k = h(x_k, u_k, v_k, k)$ wherein, $h(x_k, u_k, v_k, k)$ is a measurement function; and $v_k$ is sensor noise that affects the measurement of the output of battery 12 in a memory-less mode, but does not affect the state vector of battery 12.

The system state $x_k$ includes, at least, a minimum amount of information, together with the present input and a mathematical model of the cell, needed to predict the present output. For a cell 14, the state might include: SOC, polarization voltage levels with respect to different time constants, and hysteresis levels, for example. The system exogenous input $u_k$ includes at minimum the present cell current $i_k$, and may, optionally, include cell temperature (unless temperature change is itself modeled in the state). The system parameters $\theta_k$ are the values that change only slowly with time, in such a way that they may not be directly determined with knowledge of the system measured input and output. These might include, but not be limited to: cell capacity, resistance, polarization voltage time constant(s), polarization voltage blending factor(s), hysteresis blending factor(s), hysteresis rate constant(s), efficiency factor(s), and so forth. The model output $y_k$ corresponds to physically measurable cell quantities or those directly computable from measured quantities at minimum for example, the cell voltage under load.

A mathematical model of parameter dynamics is also utilized. An exemplary model has the form:

$$\theta_{k+1} = \theta_k + r_k$$

$$d_k = g(x_k, u_k, \theta_k) + e_k.$$

The first equation states that the parameters $\theta_k$ are primarily constant, but that they may change slowly over time, in this instance, modeled by a "noise" process denoted, $r_k$. The "output" $d_k$ is a function of the optimum parameter dynamics modeled by $g(.,.,.)$ plus some estimation error $e_k$. The optimum parameter dynamics $g(.,.,.)$ being a function of the system state $x_k$, an exogenous input $u_k$, and the set of time varying parameters $\theta_k$.

Referring to FIGS. 2-5, a method for determining an estimated combined battery state-parameter vector indicative of both a state and a parameter of a battery 12 in accordance with an exemplary embodiment will now be explained. The method can be implemented utilizing software algorithms executed by the controller 28. The software algorithms are stored in either the ROM 44 or the RAM 45 or other computer readable mediums known to those skilled in the art.

At step 60, the computer 28 generates a battery input vector $u_k$ having at least one measured value of a battery input variable obtained at a first predetermined time.

At step 62, the computer 28 generates a battery output vector $y_k$ having at least one measured value of a battery output variable obtained at the first predetermined time.

At step 64, the computer 28 determines an estimated augmented combined battery state-parameter vector $\hat{X}_{k-1}^{a,+}$, indicative of both a state of the battery 12 and a parameter of the battery 12 at a second predetermined time prior to the first predetermined time, utilizing the equation: $\hat{X}_{k-1}^{a,+} = [(\hat{X}_{k-1}^+)^T, (E[W_{k-1}])^T, (E[v_{k-1}])^T]^T$ where, $\hat{X}_{k-1}^+$ corresponds to an estimated combined battery state-parameter vector indicative of both a state of the battery 12 and a parameter of the battery 12 at the second predetermined time;

$E[W_{k-1}]$ corresponds to an expected value of a combined battery state-parameter input noise vector at the second predetermined time;

$E[v_{k-1}]$ corresponds to an expected value of a sensor noise vector at the second predetermined time; and T is the matrix/vector transpose operation.

At step 66, the computer 28 determines an estimated augmented combined battery state-parameter vector covariance matrix $\Sigma_{\tilde{X},k-1}^{a,+}$ associated with the estimated augmented combined battery state-parameter vector, utilizing the equation:

$$\Sigma_{\tilde{X},k-1}^{a,+} = \text{diag}\left(\sum_{\tilde{X},k-1}^+, \sum_W, \sum_v\right)$$

where, $$\Sigma_{\tilde{X},k-1}^+$$

corresponds to an estimated combined battery state-parameter vector covariance matrix associated with the estimated combined battery state-parameter vector at the second predetermined time;

$\Sigma_W$ corresponds to a covariance matrix associated with a combined battery state-parameter input noise vector;

$\Sigma_v$ corresponds to a covariance matrix associated with a sensor noise vector; and diag( ) is a function that composes a block-diagonal matrix from its input arguments.

At step 68, the computer 28 determines a plurality of estimated augmented combined battery state-parameter vectors $X_{k-1}^{a,+}$ each indicative of both a state of the battery 12 and a parameter of the battery 12 at the second predetermined time, utilizing the following equation:

$$X_{k-1}^{a,+} = \left\{ \hat{X}_{k-1}^{a,+}, \hat{X}_{k-1}^{a,+} + \gamma\sqrt{\Sigma_{\tilde{X},k-1}^{a,+}}, \hat{X}_{k-1}^{a,+} - \gamma\sqrt{\Sigma_{\tilde{X},k-1}^{a,+}} \right\}$$

where, $$\sqrt{\Sigma_{\tilde{X},k-1}^{a,+}}$$

corresponds to the Cholesky matrix square root of $\Sigma_{X,k-1}^{a,+}$; and $\gamma$ corresponds to a constant value.

At step 70, the computer 28 determines a plurality of predicted combined battery state-parameter vectors $X_k^{X,-}$ each indicative of both a state of the battery 12 and a parameter of the battery 12 at the first predetermined time, utilizing the following equation: $X_{k,i}^{X,-}=F(X_{k-1,i}^{X,+},u_{k-1},X_{k-1,i}^{W,+},k-1)$, where $X_{k,i}^{X,-}$ corresponds to the ith member of the plurality $X_k^{X,-}$ $u_{k-1}$ corresponds to a battery input vector at the second predetermined time;

$X_{k-1,i}^{X,+}$ corresponds to an estimated combined battery state-parameter vector extracted from the ith member of the plurality $X_{k-1}^{a,+}$;

$X_{k-1,i}^{W,+}$ corresponds to an estimated combined battery state-parameter input noise vector, extracted from the ith member of the plurality $X_{k-1}^{a,+}$;

$F(X_{k-1,i}^{X,+},u_{k-1},X_{k-1,i}^{W,+},k-1)$ corresponds to an equation that models the dynamics of the combined state-parameter vector; and k−1 corresponds to the second predetermined time.

At step 72, the computer 28 determines a plurality of predicted battery output vectors $Y_k$ each indicative of outputs of the battery 12 at the first predetermined time, utilizing the following equation: $Y_{k,i}=h(X_{k,i}^{X,-},u_k,X_{k-1,i}^{v,+},k)$, where $Y_{k,i}$ corresponds to the ith member of the plurality $Y_k$;

$X_{k-1,i}^{v,+}$ corresponds to a single estimated sensor noise vector extracted from the ith member of the plurality $X_{k-1}^{a,+}$; and k corresponds to the first predetermined time.

At step 74, the computer 28 determines a predicted combined battery state-parameter vector $\hat{X}_k^-$ corresponding to the first predetermined time by calculating a weighted average of the plurality of predicted combined battery state-parameter vectors $X_k^{X,-}$, utilizing the following equation:

$$\hat{X}_k^- = \sum_{i=0}^{p} \alpha_i^{(m)} X_{k,i}^{X,-}$$

where, $\alpha_i^{(m)}$ corresponds to a set of constant values; and p corresponds to the number of members in the plurality $X_k^{X,-}$, minus one.

At step 76, the computer 28 determines a predicted combined battery state-parameter vector covariance matrix $$\Sigma_{\tilde{X},k}^-.$$

utilizing the following equation:

$$\Sigma_{\tilde{X},k}^- = \sum_{i=0}^{p} \alpha_i^{(c)} (X_{k,i}^{X,-} - \hat{X}_k^-)(X_{k,i}^{X,-} - \hat{X}_k^-)^T$$

where, $\alpha_i^{(c)}$ corresponds to a set of constant values.

At step 78, the computer 28 determines a predicted battery output vector $\hat{y}_k$ indicative of outputs of the battery at the first predetermined time, utilizing the following equation:

$$\hat{y}_k = \sum_{i=0}^{p} \alpha_i^{(m)} Y_{k,i}.$$

At step 80, the computer 28 determines a predicted battery output vector covariance matrix $\Sigma_{\tilde{y},k}$, utilizing the following equation:

$$\Sigma_{\tilde{y},k} = \sum_{i=0}^{p} \alpha_i^{(c)} (Y_{k,i} - \hat{y}_k)(Y_{k,i} - \hat{y}_k)^T.$$

At step 82, the computer 28 determines a predicted cross-covariance matrix $\Sigma_{\tilde{X}\tilde{y},k}^-$, utilizing the following equation:

$$\Sigma_{\tilde{X}\tilde{y},k}^- = \sum_{i=0}^{p} \alpha_i^{(c)} (X_{k,i}^{X,-} - \hat{X}_k^-)(Y_{k,i} - \hat{y}_k)^T.$$

At step 84, the computer 28 determines a gain matrix $L_k$, utilizing the following equation:

$$L_k = \Sigma_{\tilde{X}\tilde{y},k}^- \Sigma_{\tilde{y},k}^{-1}.$$

At step 86, the computer 28 determines an estimated combined battery state-parameter vector $\hat{X}_k^+$, indicative of both the state of the battery 12 and the parameter of the battery 12 at the first predetermined time, utilizing the following equation:

$$\hat{X}_k^+ = \hat{X}_k^- + L_k[y_k - \hat{y}_k].$$

At step 88, the computer 28 determines an estimated combined battery state-parameter vector covariance matrix $\Sigma_{X,k}^+$, associated with the estimated combined battery state-parameter vector, utilizing the following equation:

$$\Sigma_{\tilde{X},k}^+ = \Sigma_{\tilde{X},k}^- - L_k \Sigma_{\tilde{y},k} L_k^T.$$

At step 90, the computer 28 selects new first and second predetermined times. After step 90, the method returns to step 60.

Referring to FIGS. 6-9, a method for determining an estimated combined battery state-parameter vector indicative of both a state and a parameter of a battery 12 in accordance with another exemplary embodiment will now be explained. The method can be implemented utilizing software algorithms executed by the controller 28. The software algorithms are stored in either the ROM 44 or the RAM 45 or other computer readable mediums known to those skilled in the art.

At step 100, the computer 28 generates a battery input vector $u_k$ having at least one measured value of a battery input variable obtained at a first predetermined time.

At step 101, the computer 28 generates a battery output vector $y_k$ having at least one measured value of a battery output variable obtained at the first predetermined time.

At step 102, the computer 28 determines an estimated augmented combined battery state-parameter vector $\hat{X}_{k-1}^{a,+}$, indicative of both a state of the battery 12 and a parameter of the battery 12 at a second predetermined time prior to the first predetermined time, utilizing the equation:

$$\hat{X}_{k-1}^{a,+} = [(\hat{X}_{k-1}^+)^T, (E[W_{k-1}])^T, (E[v_{k-1}])^T]^T \text{ where,}$$

$\hat{X}_{k-1}^+$ corresponds to an estimated combined battery state-parameter vector indicative of both a state of the battery 12 and a parameter of the battery 12 at the second predetermined time;

$E[W_{k-1}]$ corresponds to an expected value of a combined battery state-parameter input noise vector at the second predetermined time;

$E[v_{k-1}]$ corresponds to an expected value of a sensor noise vector at the second predetermined time; and T is the matrix/vector transpose operation.

At step 104, the computer 28 determines an estimated augmented combined battery state-parameter vector square-root covariance matrix $S_{X,k-1}^{a,a}$ associated with the estimated augmented combined battery state-parameter vector, utilizing the equation: $S_{X,k-1}^{a,+} = \text{diag}(S_{X,k-1}^+, S_w, S_v)$. where, $S_{X,k-1}^+$ corresponds to an estimated combined battery state-parameter vector square-root covariance matrix associated with the estimated combined battery state-parameter vector at the second predetermined time;

$S_W$ corresponds to a square-root covariance matrix associated with a combined battery state-parameter input noise vector;

$S_v$ corresponds to a square-root covariance matrix associated with a sensor noise vector; and diag( ) is a function that composes a block-diagonal matrix from its input arguments.

At step 106, the computer 28 determines a plurality of estimated augmented combined battery state-parameter vectors $X_{k-1}^{a,+}$ each indicative of both a state and of a parameter of a battery 12 at the second predetermined time using the following equation:

$$X_{k-1}^{a,+} = \{\hat{X}_{k-1}^{a,+}, \hat{X}_{k-1}^{a,+} + \gamma S_{X,k-1}^{a,+}, \hat{X}_{k-1}^{a,+} - \gamma S_{Xk-1}^{a,+}\}$$
where, $\gamma$ corresponds to a constant value.

At step 108, the computer 28 determines a plurality of predicted combined battery state-parameter vectors $X_k^{X,-}$ each indicative of both a state of the battery 12 and a parameter of the battery 12 at the first predetermined time, utilizing the following equation: $X_{k,i}^{X,-} = F(X_{k-1,i}^{X,+}, u_{k-1}, X_{k-1,i}^{W,+}, k-1)$ where, $X_{k,i}^{X,-}$ corresponds to the ith member of the plurality $X_k^{X,-}$;

$u_{k-1}$ corresponds to a battery input vector at the second predetermined time;

$X_{k-1,i}^{X,+}$ corresponds to an estimated combined battery state-parameter vector extracted from the ith member of the plurality $X_{k-1}^{a,+}$;

$X_{k-1,i}^{W,+}$ corresponds to an estimated combined battery state-parameter input noise vector, extracted from the ith member of the plurality $X_{k-1}^{a,+}$;

$F(X_{k-1,i}^{X,+}, u_{k-1}, X_{k-1,i}^{W,+}, k-1)$ corresponds to an equation that models the dynamics of the combined state-parameter vector; and k-1 corresponds to the second predetermined time.

At step 110, the computer 28 determines a plurality of predicted battery output vectors $Y_k$ each indicative of outputs of the battery 12 at the first predetermined time, utilizing the following equation: $Y_{k,i} = h(X_{k,i}^{X,-}, u_k, X_{k-1,i}^{v,+}, k)$ where, $Y_{k,i}$ corresponds to the ith member of the plurality $Y_k$;

$X_{k-1,i}^{v,+}$ corresponds to a single estimated sensor noise vector extracted from the ith member of the plurality $X_{k-1}^{a,+}$; and k corresponds to the first predetermined time.

At step 112, the computer 28 determines a predicted combined battery state-parameter vector $\hat{X}_k^-$ corresponding to the first predetermined time by calculating a weighted average of the plurality of predicted combined battery state-parameter vectors $X_k^{X,-}$, utilizing the following equation:

$$\hat{X}_k^- = \sum_{i=0}^{p} \alpha_i^{(m)} X_{k,i}^{X,-}$$

where, $\alpha_i^{(m)}$ corresponds to a set of constant values; and p corresponds to the number of members in the plurality $X_k^{X,-}$, minus one.

At step 114, the computer 28 determines a predicted combined battery state-parameter vector square-root covariance matrix $S_{X,k}^-$, utilizing the following equation:

$$S_{\tilde{X},k}^- = qr\left\{\left[\sqrt{\alpha_i^{(c)}}\left(X_{k,(0:p)}^{X,-} - \hat{X}_k^-\right)^T\right]\right\}^T.$$

where, $\alpha_i^{(c)}$ corresponds to a set of constant values and qr{ } is a function that computes a Q-R matrix decomposition of its input argument and returns the upper-triangular portion of the R matrix.

At step 116, the computer 28 determines a predicted battery output vector $\hat{y}_k$ indicative of outputs of the battery 12 at the first predetermined time, utilizing the following equation:

$$\hat{y}_k = \sum_{i=0}^{p} \alpha_i^p \alpha_i^{(m)} Y_{k,i}.$$

At step 118, the computer 28 determines a predicted battery output vector square-root covariance matrix $S_{y,k}$, utilizing the following equation:

$$S_{\tilde{y},k} = qr\left\{\left[\sqrt{\alpha_i^{(c)}}\left(Y_{k,(0:p)} - \hat{y}_k\right)^T\right]\right\}^T.$$

At step 120, the computer 28 determines a predicted cross-covariance matrix $\Sigma_{\tilde{x}\tilde{y},k}^{-}$, utilizing the following equation:

$$\Sigma_{\tilde{x}\tilde{y},k}^{-} = \sum_{i=0}^{p} \alpha_i^{(c)} (X_{k,i}^{x,-} - \hat{X}_k^{-})(Y_{k,i} - \hat{y}_k)^T.$$

At step 122, the computer 28 determines a gain matrix $L_k$, utilizing the following equation: $L_k = \Sigma_{xy,k}^{-}(S_{y,k}^{-T}S_{y,k}^{-})^{-1}$.

At step 124, the computer 28 determines an estimated combined battery state-parameter vector $\hat{X}_k^{+}$, indicative of both the state of the battery 12 and the parameter of the battery 12 at the first predetermined time, utilizing the following equation:

$$\hat{X}_k^{+} = \hat{X}_k^{-} + L_k[y_k - \hat{y}_k].$$

At step 126, the computer 28 determines an estimated combined battery state-parameter vector square-root covariance matrix $S_{X,k}^{+}$ associated with the estimated combined battery state-parameter vector, utilizing the following equation:

$$S_{X,k}^{+} = \text{downdate}\{S_{X,k}^{-}, L_k S_{y,k}\} \text{ where,}$$

downdate{ } computes the matrix downdate operation on its first argument using its second argument.

At step 128, the computer 28 selects new first and second predetermined times. After step 128, the method returns to step 100.

The system, method, and article of manufacture for determining an estimated combined battery state-parameter vector indicative of both a state and a parameter of a battery 12 provide a substantial advantage over other systems and methods. In particular, the system, method, and article of manufacture provide a technical effect of more accurately determining the combined battery state-parameter vector for a battery having non-linear operational characteristics.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to the exemplary embodiments, it will be understood by those skilled in the art that various changes may be made and equivalent elements may be substituted for elements thereof without departing from the scope of the invention. In addition, many modifications may be made to the teachings of the invention to adapt to a particular situation without departing from the scope thereof. Therefore, it is intended that the invention not be limited the embodiment disclosed for carrying out this invention, but that the invention includes all embodiments falling with the scope of the intended claims. Moreover, the use of the terms first, second, etc. does not denote any order of importance, but rather the terms first, second, etc. are used to distinguish one element from another.

What is claimed is:

1. An article of manufacture, comprising:
  a computer storage medium having a computer program encoded therein for determining an estimated combined battery state-parameter vector indicative of a state and a parameter of a battery at a first predetermined time, the computer storage medium comprising:
  code for determining a first plurality of estimated augmented combined battery state-parameter vectors that are indicative of both a state and a parameter of the battery, a battery input noise, a sensor noise associated with a sensor measuring a battery output variable, an uncertainty of both the state and parameter of the battery, an uncertainty of the battery input noise, and an uncertainty of the sensor noise at a second predetermined time prior to the first predetermined time;
  code for determining a second plurality of predicted combined battery state-parameter vectors that are indicative of the state and the parameter of the battery and an uncertainty of both the state and parameter of the battery at the first predetermined time based on the first plurality of estimated augmented combined battery state-parameter vectors;
  code for determining a third plurality of predicted battery output vectors that are indicative of at least one output variable of the battery and of an uncertainty of the output variable at the first predetermined time based on the first plurality of estimated augmented combined battery state-parameter vectors and the second plurality of predicted combined battery state-parameter vectors;
  code for determining a first battery output vector having at least one measured value of the battery output variable; and
  code for determining a first estimated combined battery state-parameter vector indicative of both the state and the parameter of the battery at the first predetermined time based on the second plurality of predicted combined battery state-parameter vectors, the third plurality of predicted battery output vectors, and the first battery output vector.

2. The article of manufacture of claim 1, wherein the code for determining the first estimated combined battery state-parameter vector comprises:
  code for determining a first predicted combined battery state-parameter vector indicative of both the state and the parameter of the battery at the first predetermined time based on the second plurality of predicted combined battery state-parameter vectors;
  code for determining a first predicted battery output vector indicative of at least one output variable of the battery at the first predetermined time based on the third plurality of predicted output vectors;
  code for determining a gain matrix based on the first predicted combined battery state-parameter vector, the first predicted battery output vector, the second plurality of predicted combined battery state-parameter vectors, and the third plurality of predicted battery output vectors; and
  code for calculating the first estimated combined battery state-parameter vector based on the first predicted combined battery state-parameter vector, the first predicted battery output vector, the gain matrix, and the first battery output vector.

* * * * *